(12) United States Patent
Kim et al.

(10) Patent No.: US 11,244,813 B2
(45) Date of Patent: Feb. 8, 2022

(54) APPARATUS AND METHOD FOR TREATING SUBSTRATE

(71) Applicant: SEMES CO., LTD., Chungcheongnam-do (KR)

(72) Inventors: Sung Yoep Kim, Busan (KR); Seok Ro Lee, Gyeonggi-do (KR); Yeong Hun Wi, Busan (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 16/936,200

(22) Filed: Jul. 22, 2020

(65) Prior Publication Data

US 2021/0027997 A1 Jan. 28, 2021

(30) Foreign Application Priority Data

Jul. 22, 2019 (KR) .................. 10-2019-0088352

(51) Int. Cl.
*H01J 37/32* (2006.01)
*H01L 21/67* (2006.01)

(52) U.S. Cl.
CPC .... *H01J 37/32834* (2013.01); *H01J 37/3244* (2013.01); *H01L 21/67069* (2013.01); *H01J 2237/334* (2013.01)

(58) Field of Classification Search
CPC ............ H01L 21/6719; H01L 21/67069; H01J 37/32834; H01J 37/3244; H01J 2237/334
See application file for complete search history.

(56) References Cited

U.S. PATENT DOCUMENTS

| | | | | |
|---|---|---|---|---|
| 5,413,167 A | * | 5/1995 | Hara | G03F 7/707 |
| | | | | 165/104.33 |
| 2018/0274093 A1 | * | 9/2018 | Takagi | C23C 16/448 |

FOREIGN PATENT DOCUMENTS

| | | | |
|---|---|---|---|
| JP | 2001-073741 A | | 3/2001 |
| JP | 2002-299355 A | | 10/2002 |
| JP | 2002299355 A | * | 10/2002 |
| JP | 2003-163169 A | | 6/2003 |
| JP | 2003163169 A | * | 6/2003 |
| KR | 10-2010-0024820 A | | 3/2010 |
| KR | 10-2019-0048531 A | | 5/2019 |

OTHER PUBLICATIONS

Office Action for related Korean Patent Application No. 10-2019-0088352 dated Nov. 9, 2020 (4 pages).

* cited by examiner

*Primary Examiner* — Yuechuan Yu
(74) *Attorney, Agent, or Firm* — Procopio, Cory, Hargreaves & Savitch, LLP

(57) ABSTRACT

An apparatus for treating a substrate includes a chamber having a treatment space in which the substrate is treated, a substrate support unit that supports the substrate in the treatment space, a gas supply unit that supplies a gas into the treatment space, an exhaust line connected to the chamber, and a pressure-reducing member that reduces pressure in the exhaust line and releases process by-products generated in the treatment space. The exhaust line includes a first line connected to the chamber, a second line equipped with the pressure-reducing member, and a filter tube that connects the first line and the second line, and the filter tube has a corrugated side surface.

14 Claims, 9 Drawing Sheets

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0088352 filed on Jul. 22, 2019, in the Korean Intellectual Property Office, the entire contents of which are hereby incorporated by reference.

BACKGROUND

Embodiments of the inventive concept described herein relate to an apparatus and method for treating a substrate with gas.

Various processes, such as photolithography, etching, thin-film deposition, ion implantation, cleaning, and the like, are performed to manufacture semiconductor elements. A substrate treating apparatus using gas is used in the etching process, the thin-film deposition process, the ion implantation process, and the cleaning process among these processes.

In a gas treatment process, a process gas is supplied into a chamber, and a substrate is treated with the process gas. In the process of treating the substrate with the process gas, a large amount of process by-products are generated. The process by-products are released through an exhaust line. The exhaust line is equipped with a pressure-reducing member, and the process by-products are forcibly released by negative pressure applied by the pressure-reducing member.

In general, the process by-products adhere to the exhaust line and the pressure-reducing member while being forcibly released. The process by-products adhering to the exhaust line and the pressure-reducing member may flow back to the space in which the substrate is treated, or may damage the pressure-reducing member. In particular, the process by-products adhering to the exhaust line are very difficult to remove.

Due to this, to minimize deposition of the process by-products, the exhaust line is equipped with a heater. The heater raises the temperature of the exhaust line and reduces deposition of the process by-products. In this case, the amount of the process by-products deposited on the pressure-reducing member is increased, and pressure-reducing member replacement frequency is raised. The pressure-reducing member is connected to a plurality of spaces, and therefore it is not easy to replace the pressure-reducing member.

SUMMARY

Embodiments of the inventive concept provide an apparatus for reducing the amount of process by-products adhering to an exhaust line and a pressure-reducing member.

According to an exemplary embodiment, an apparatus for treating a substrate includes a chamber having a treatment space in which the substrate is treated, a substrate support unit that supports the substrate in the treatment space, a gas supply unit that supplies a gas into the treatment space, an exhaust line connected to the chamber, and a pressure-reducing member that reduces pressure in the exhaust line and releases process by-products generated in the treatment space. The exhaust line includes a first line connected to the chamber, a second line equipped with the pressure-reducing member, and a filter tube that connects the first line and the second line, and the filter tube has a corrugated side surface.

The filter tube may be detachable from the first line and the second line. An outer circumferential surface of the filter tube may have a corrugated shape, and the filter tube may have a lower temperature than the first line and the second line.

Temperature outside the filter tube may be lower than temperature inside the filter tube, and the filter tube may be formed of a material having a higher thermal conductivity than the first line and the second line.

The second line may be equipped with a valve that opens or closes the exhaust line.

The filter tube may have a corrugated outer circumferential surface, and the filter tube may include a body having opposite open ends and an inner protrusion protruding from an inner surface of the body.

The inner protrusion may have a spiral shape that surrounds a central axis of the body.

The inner protrusion may include a plurality of inner protrusions having an annular ring shape and arranged along a lengthwise direction of the body.

In a cut section obtained by cutting the filter tube in a lengthwise direction, the inner protrusion may be provided to be inclined such that a direction from the inner surface of the body toward an inside end thereof is oriented in an upstream direction of the filter tube with an approach to a central axis of the body.

According to an exemplary embodiment, a method for treating the substrate using the apparatus includes treating the substrate by supplying the gas to the substrate located in the treatment space and performing maintenance of the apparatus after unloading the substrate from the treatment space. During the performance of the maintenance, the filter tube is separated from the first line and the second line and is replaced.

During the performance of the maintenance, a cleaning pump may be connected to the first line to release remaining particles in the treatment space after the separation of the filter tube and before the replacement of the filter tube. The filter tube may have a larger exposed area than the first line and the second line so that the filter tube has a lower temperature than the first lien and the second line, the exposed area being an area by which the filter tube is exposed to the outside.

The gas may be a gas for etching the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, a substrate treating apparatus for etching a substrate using plasma according to an embodiment of the inventive concept will be described. Without being limited thereto, however, the inventive concept is applicable to various types of apparatuses for treating a substrate using gas.

Figure 1:
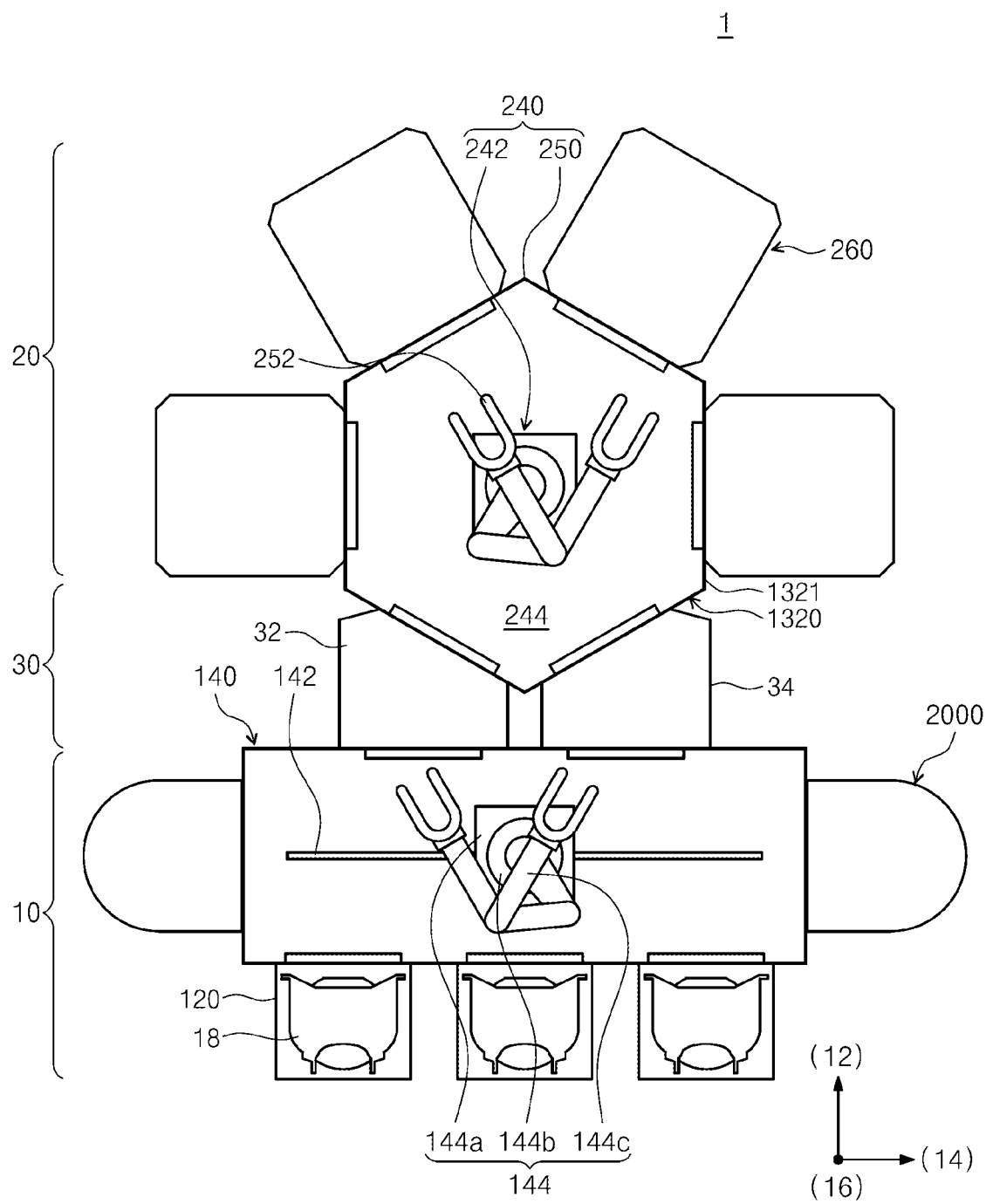
FIG. 1 is a schematic plan view illustrating substrate treating equipment according to an embodiment of the inventive concept.

FIG. 1 is a schematic plan view illustrating substrate treating equipment according to an embodiment of the inventive concept.

Referring to FIG. 1, the substrate treating equipment 1 has an index module 10, a loading module 30, and a process module 20. The index module 10 has a load port 120, a transfer frame 140, and a buffer unit 2000. The load port 120, the transfer frame 140, and the process module 20 are sequentially arranged in a row. Hereinafter, a direction in which the load port 120, the transfer frame 140, the loading module 30, and the process module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

A carrier 18 having a plurality of substrates W received therein is placed on the load port 120. A plurality of load ports 120 are provided. The load ports 120 are disposed in a row along the second direction 14. FIG. 1 illustrates one example that the index module 10 has three load ports 120. However, the number of load ports 120 may be increased or decreased depending on conditions such as process efficiency and footprint of the process module 20. A plurality of slots (not illustrated) that support the edges of the substrates W are formed in the carrier 18. The plurality of slots are arranged along the third direction 16, and the substrates W are located in the carrier 18 so as to be stacked one above another with a spacing gap therebetween along the third direction 16. A front opening unified pod (FOUP) may be used as the carrier 18.

The transfer frame 140 transfers the substrates W between the carriers 18 placed on the load ports 120, the buffer unit 2000, and the loading module 30. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 has a base 144a, a body 144b, and an index arm 144c. The base 144a is installed so as to be movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c are provided. The index arms 144c are individually driven. The index arms 144c are stacked one above another with a spacing gap therebetween along the third direction 16. Some of the index arms 144c may be used to transfer the substrates W from the process module 20 to the carriers 18, and the other index arms 144c may be used to transfer the substrates W from the carriers 18 to the process module 20. Accordingly, particles generated from the substrates W that are to be treated may be prevented from adhering to the treated substrates W in a process in which the index robot 144 transfers the substrates W between the carriers 18 and the process module 20.

The buffer unit 2000 temporarily stores the substrates W. In the buffer unit 2000, process by-products remaining on the substrates W are removed. The removal of the process by-products in the buffer unit 2000 is performed by supplying a purge gas into the buffer unit 2000. A plurality of buffer units 2000 may be provided. For example, two buffer units 2000 may be provided. The two buffer units 2000 may be provided on opposite sides of the transfer frame 140 and may be located to be opposite to each other, with the transfer frame 140 therebetween. Selectively, only one buffer unit 2000 may be provided on one side of the transfer frame 140.

The loading module 30 is disposed between the transfer frame 140 and a transfer chamber 250. The loading module 30 provides a space in which the substrates W stay before transferred between the transfer chamber 250 and the transfer frame 140. The loading module 30 includes a load-lock chamber 32 and an unload-lock chamber 34. The load-lock chamber 32 and the unload-lock chamber 34 are provided such that the insides thereof are able to be switched between a vacuum atmosphere and an atmospheric atmosphere.

The load-lock chamber 32 provides a space in which the substrates W to be transferred from the index module 10 to the process module 20 temporarily stay. When the substrates W are placed in the load-lock chamber 32, the interior space of the load-lock chamber 32 is sealed from the index module 10 and the process module 20. Thereafter, the interior space of the load-lock chamber 32 is switched from the atmospheric atmosphere to the vacuum atmosphere, and the load-lock chamber 32 is open toward the process module 20 in the state of being sealed from the index module 10.

The unload-lock chamber 34 provides a space in which the substrates W to be transferred from the process module 20 to the index module 10 temporarily stay. When the substrates W are placed in the unload-lock chamber 34, the interior space of the unload-lock chamber 34 is sealed from the index module 10 and the process module 20. Thereafter, the interior space of the unload-lock chamber 34 is switched from the vacuum atmosphere to the atmospheric atmosphere, and the unload-lock chamber 34 is open toward the index module 10 in the state of being sealed from the process module 20.

The process module 20 includes the transfer chamber 250 and a plurality of process chambers 260.

The transfer chamber 250 transfers the substrates W between the load-lock chamber 32, the unload-lock chamber 34, and the plurality of process units 260. The transfer chamber 250 may have a hexagonal shape when viewed from above. Selectively, the transfer chamber 250 may have a rectangular or pentagonal shape. The load-lock chamber 32, the unload-lock chamber 34, and the plurality of process chambers 260 are located around the transfer chamber 250. A transfer robot 242 is provided in the transfer chamber 250. The transfer robot 242 may be located in the center of the transfer chamber 250. The transfer robot 242 may have a plurality of hands 252 that are movable in the horizontal and vertical directions and are movable forward or backward or rotatable on the horizontal plane. The hands 252 may be independently driven, and the substrates W may be seated on the hands 252 in a horizontal state.

A substrate treating apparatus 1000 provided in each of the process chambers 260 will be described below. The substrate treating apparatus 1000 performs an etching process on the substrate W.

Figure 2:
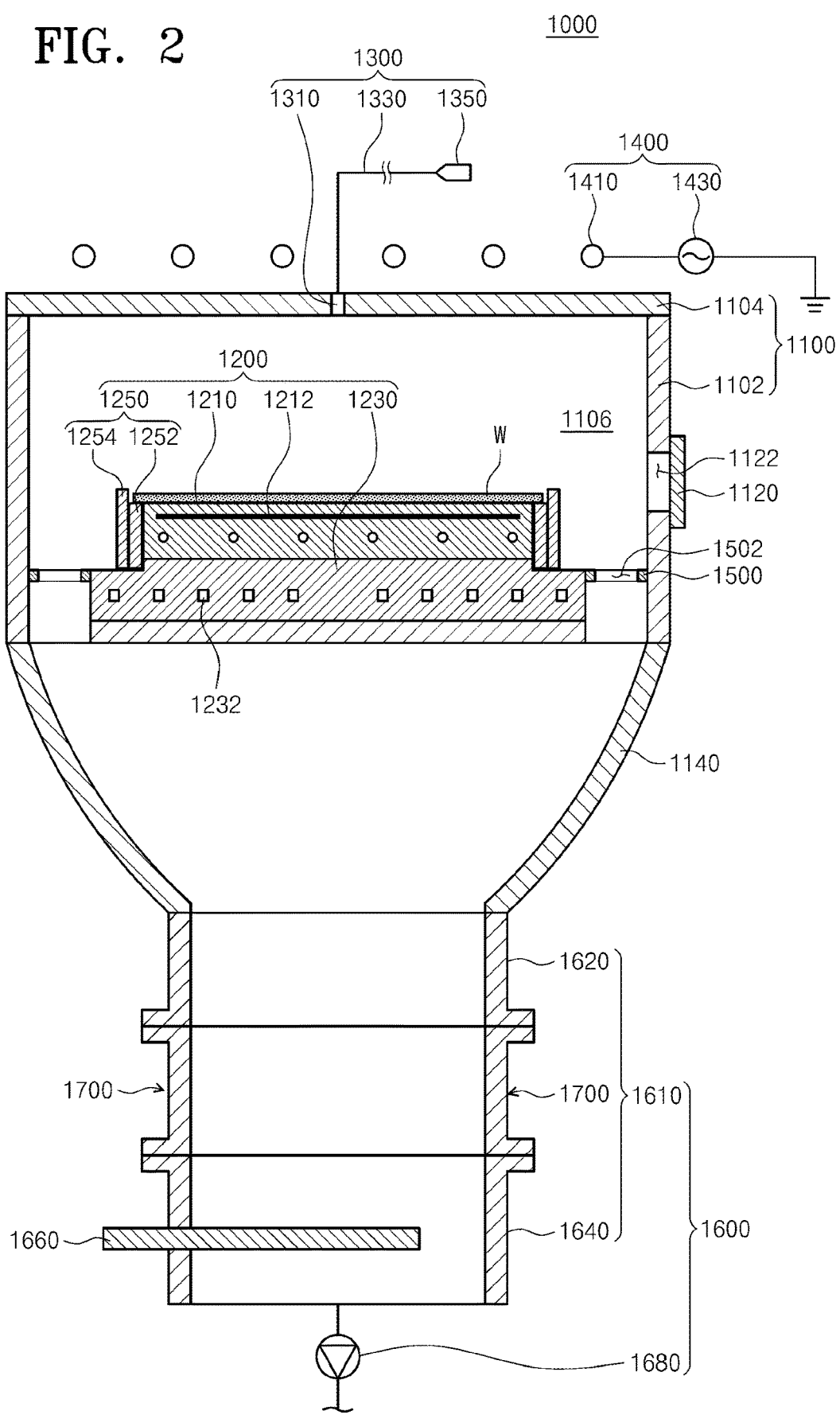
FIG. 2 is a sectional view illustrating a substrate treating apparatus of FIG. 1.

FIG. 2 is a sectional view illustrating the substrate treating apparatus of FIG. 1. Referring to FIG. 2, the substrate treating apparatus 1000 includes a chamber 1100, a substrate support unit 1200, a gas supply unit 1300, a plasma source 1400, a baffle 1500, and an exhaust unit 1600.

The chamber 1100 has a treatment space 1106 in which the substrate W is treated. The chamber 1100 has a cylindrical shape. The chamber 1100 is formed of a metallic material. For example, the chamber 1100 may be formed of an aluminum material. The chamber 1100 has an entrance/exit opening 1122 formed in a sidewall 1102 thereof. The entrance/exit opening 1122 functions as an opening through which the substrate W enters or exits the chamber 1100. The entrance/exit opening 1122 is opened or closed by a door 1120. An exhaust port 1140 is provided at the bottom of the chamber 1100. The exhaust port 1140 is located under the substrate support unit 1200. The exhaust port 1140 functions as an outlet through which the treatment space 1106 is evacuated. The exhaust port 1140 is located such that the central axis thereof is in agreement with the central axis of the chamber 1100.

The substrate support unit 1200 supports the substrate W in the treatment space 1106. The substrate support unit 1200 may be implemented with an electrostatic chuck that supports the substrate W using an electrostatic force. Selectively, the substrate support unit 1200 may support the substrate W in various manners such as mechanical clamping.

The substrate support unit 1200 includes a support plate 1210, a partitioning member, a base 1230, and a focus ring 1250. The support plate 1210 has a circular plate shape. The support plate 1210 may be a dielectric plate formed of a dielectric substance. The support plate 1210 may have a smaller radius than the substrate W. The support plate 1210 may have, in an upper surface thereof, a plurality of gas holes through which a temperature adjustment gas is supplied to a lower surface of the substrate W placed on the support plate 1210. An electrode 1212 for chucking is installed inside the support plate 1210. A power supply (not illustrated) is connected to the electrode 1212 for chucking. Power is applied from the power supply (not illustrated) to the electrode 1212, and the substrate W is clamped to the support plate 1210 by an electrostatic force.

The base 1230 supports the support plate 1210. The base 1230 is located under the support plate 1210 and is fixedly coupled with the support plate 1210. An upper surface of the base 1230 has a stepped shape such that a central region is located in a higher position than an edge region. The central region of the upper surface of the base 1230 has an area corresponding to a lower surface of the support plate 1210. A cooling line 1232 is formed inside the base 1230. The cooling line 1232 serves as a passage through which a cooling fluid circulates. The cooling line 1232 may be provided in a spiral shape inside the base 1230. The base 1230 is connected with an RF power supply (not illustrated) located outside. The RF power supply (not illustrated) applies power to the base 1230. The power applied to the base 1230 guides plasma generated in the chamber 1100 toward the base 1230. The base 1230 may be formed of a metallic material.

The focus ring 1250 concentrates the plasma on the substrate W. The focus ring 1250 is implemented with a ring member that surrounds the support plate 1210. The focus ring 1250 includes an inner ring 1252 and an outer ring 1254. The inner ring 1252 has an annular ring shape that surrounds the support plate 1210. The inner ring 1252 is located on the edge region of the base 1230. An upper surface of the inner ring 1252 has the same height as the upper surface of the support plate 1210. An inner portion of the upper surface of the inner ring 1252 supports an edge region of the lower surface of the substrate W. For example, the inner ring 1252 may be formed of a conductive material. The outer ring 1254 has an annular ring shape that surrounds the inner ring 1252. The outer ring 1254 is located adjacent to the inner ring 1252 on the edge region of the base 1230. The outer ring 1254 has an upper end in a higher position than an upper end of the inner ring 1252. The outer ring 1254 may be formed of an insulating material.

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall 1104 of the chamber 1100. The gas intake port 1310 is located to face the substrate support unit 1200. According to an embodiment, the gas intake port 1310 may be installed in the center of the upper wall 1104 of the chamber 1100. The gas supply line 1330 may be equipped with a valve that opens or closes an internal passage of the gas supply line 1330 or regulates the flow rate of the process gas flowing through the internal passage of the gas supply line 1330. For example, the process gas may be an etching gas.

The plasma source 1400 excites the process gas in the chamber 1100 into plasma. An inductively coupled plasma (ICP) source may be used as the plasma source 1400. The plasma source 1400 includes an antenna 1410 and an external power supply 1430. The antenna 1410 is disposed over the chamber 1100. The antenna 1410 has a spiral shape wound a plurality of times and is connected with the external power supply 1430. The antenna 1410 receives power from the external power supply 1430. The antenna 1410 to which the power is applied forms a discharge space in the interior space of the chamber 1100. The process gas staying in the discharge space may be excited into plasma.

Figure 3:
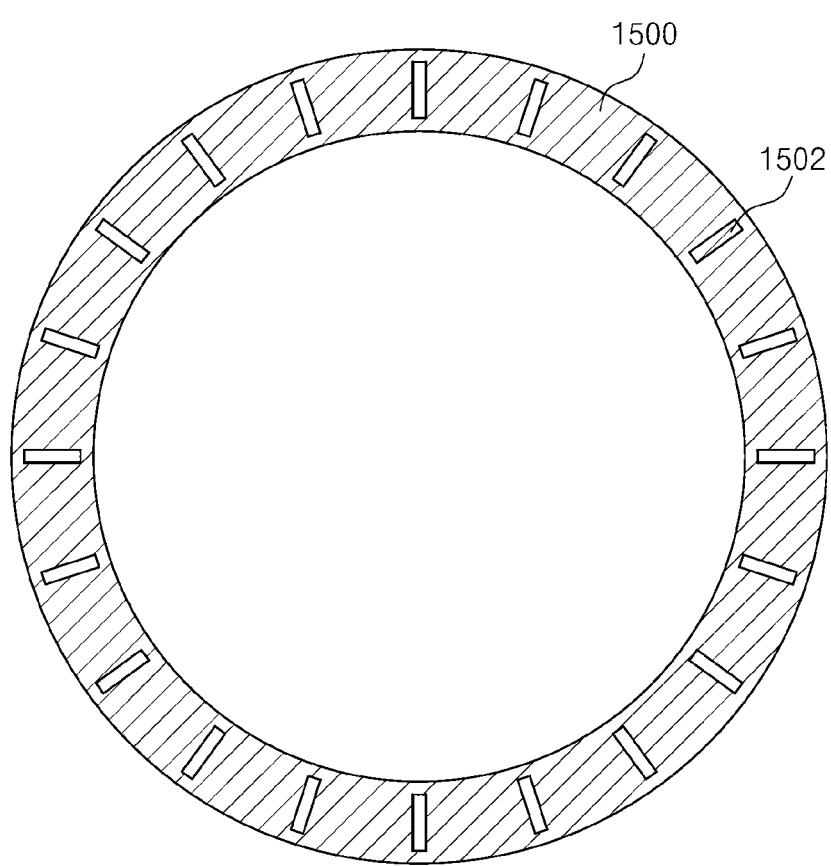
FIG. 3 is a plan view illustrating a baffle of FIG. 2.

The baffle 1500 uniformly releases the plasma from the treatment space 1106 by region. FIG. 3 is a plan view illustrating the baffle of FIG. 2. Referring to FIG. 3, the baffle 1500 has an annular ring shape. In the treatment space 1106, the baffle 1500 is located between an inner wall of the chamber 1100 and the substrate support unit 1200. The baffle 1500 has a plurality of baffle holes 1502 formed therein. The baffle holes 1502 are directed in an up-down direction. The baffle holes 1502 extend from the top of the baffle 1500 to the bottom thereof. The baffle holes 1502 are spaced apart from each other along the circumferential direction of the baffle 1500. The baffle holes 1502 have a slit shape and have a lengthwise direction directed in the radial direction.

Referring again to FIG. 2, the exhaust unit 1600 forcibly evacuates the treatment space 1106. The exhaust unit 1600 includes an exhaust line 1610, an opening/closing valve 1660, and a pressure-reducing member 1680. The exhaust line 1610 is connected to the exhaust port 1140. The exhaust line 1610 includes a first line 1620, a second line 1640, and a filter tube 1700. The first line 1620, the filter tube 1700, and the second line 1640 are implemented with lines sequentially extending along an exhaust direction. The first line 1620 extends from the exhaust port 1140. The second line 1640 is located downstream of the first line 1620 with respect to the exhaust direction. The second line 1640 may be equipped with the opening/closing valve 1660 and the pressure-reducing member 1680, and negative pressure of the pressure-reducing member 1680 may be applied to the first line 1620 and the treatment space 1106. The opening/closing valve 1660 is located upstream of the pressure-reducing member 1680 with respect to the exhaust direction.

The filter tube 1700 connects the first line 1620 and the second line 1640. The filter tube 1700 is detachable from the first line 1620 and the second line 1640. The filter tube 1700 filters process by-products generated in the treatment space 1106. The filter tube 1700 minimizes transfer of the process by-products to the opening/closing valve 1660 and the pressure-reducing member 1680. A sealing member is provided between the filter tube 1700 and the first line 1620 and between the filter tube 1700 and the second line 1640. The sealing member seals the gap between the filter tube 1700 and each of the first and second lines. The filter tube 1700 is fixedly coupled to the first line 1620 and the second line 1640 by clamps 1690. The filter tube 1700 has a corrugated side surface. The filter tube 1700 has a corrugated inner circumferential surface and a corrugated outer circumferential surface. The inner circumferential surface of the filter tube 1700 performs a function of filtering the process by-products, and the outer circumferential surface of the filter tube 1700 performs a function of lowering the temperature of the filter tube 1700.

Figure 4:
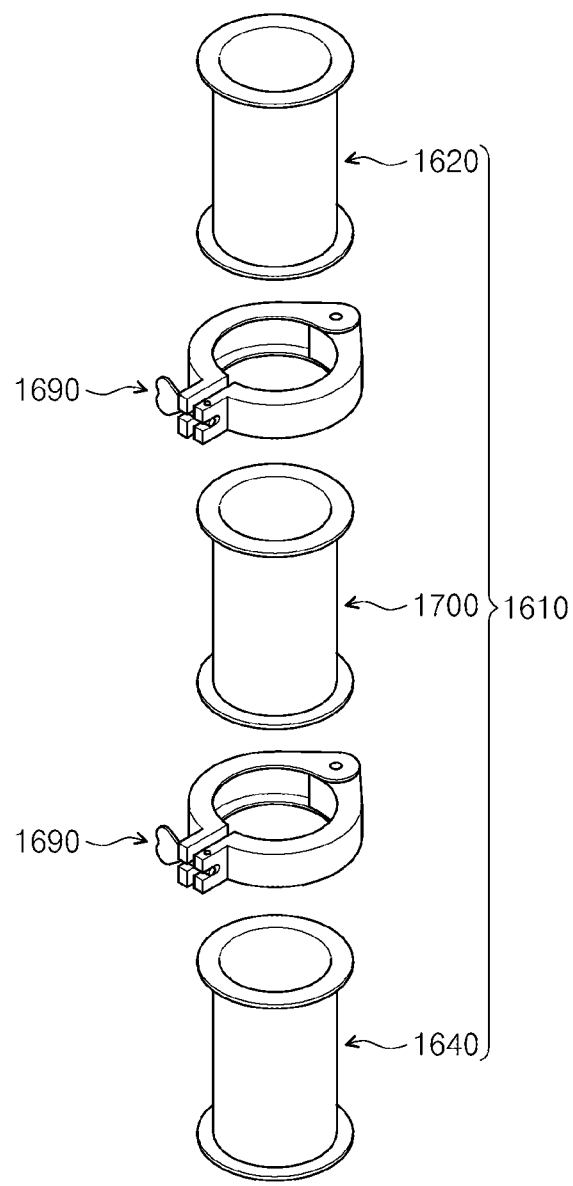
FIG. 4 is an exploded perspective view illustrating an exhaust line of FIG. 2.
Figure 5:
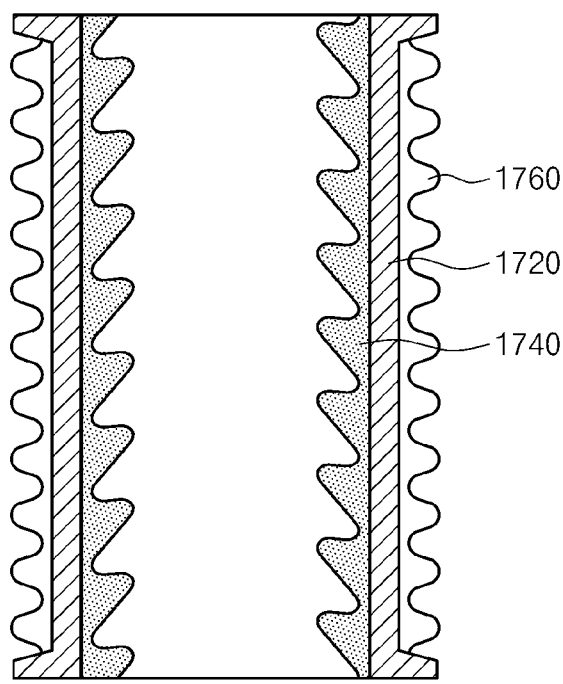
FIG. 5 is a sectional view illustrating a first embodiment of a filter tube of FIG. 4.
Figure 6:
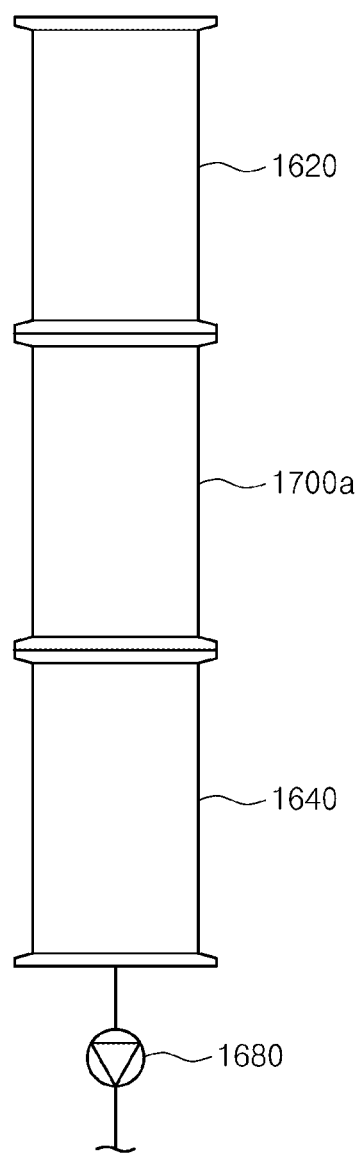
FIGS. 6 to 8 are views illustrating a process of replacing the filter tube.
Figure 7:
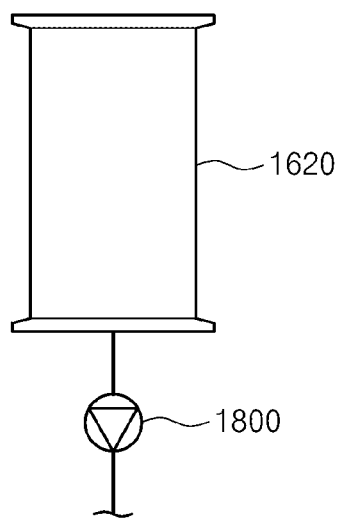
Figure 7:
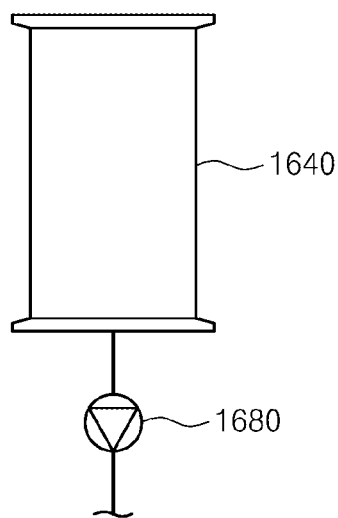
Figure 8:
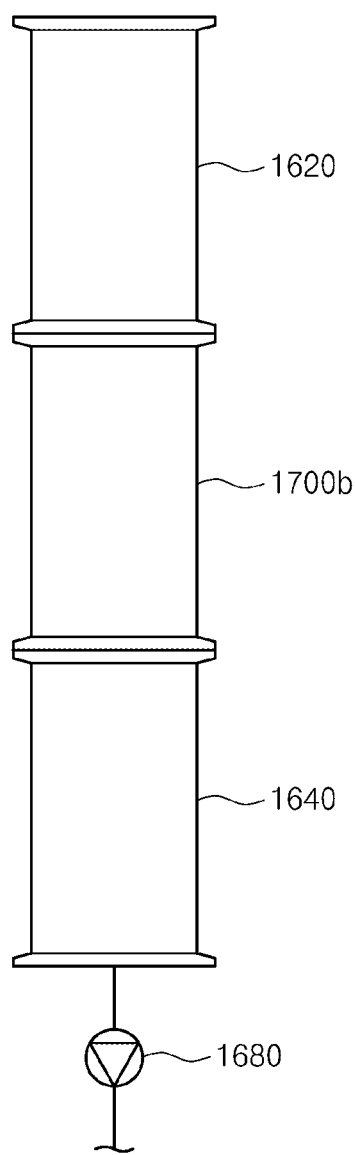

Next, the shape of the filter tube 1700 will be described in more detail. The filter tube 1700 has a body 1720, an inner protrusion 1740, and an outer protrusion 1760. FIG. 5 is a sectional view illustrating a first embodiment of the filter tube of FIG. 4. Referring to FIG. 5, the body 1720 has a tubular shape that is open at opposite ends thereof. One end of the body 1720 is connected to the first line 1620, and an opposite end of the body 1720 is connected to the second line 1640. For example, the body 1720 may have a cylindrical shape. The inner protrusion 1740 protrudes from an inner circumferential surface of the body 1720. The inner protrusion 1740 may be provided in a spiral shape that surrounds the central axis of the body 1720 and extends from the one end of the body 1720 to the opposite end thereof. Accordingly, the inner protrusion 1740 may uniformly filter the process by-products, which pass through the filter tube 1700, by region. The inner protrusion 1740 is provided to be inclined such that a direction from an inner surface of the body 1720 toward an inside end thereof is oriented in an upstream direction of the filter tube 1700 with an approach to the central axis of the body 1720. Accordingly, the process by-products passing through the filter tube 1700 are stopped and filtered by the inner protrusion 1740.

The outer protrusion 1760 protrudes from an outer surface of the body 1720. The outer protrusion 1760 is provided to increase the area by which the filter tube 1700 is exposed to the outside. In general, a process of treating the substrate W is performed at a higher temperature than room temperature. That is, the temperature outside the filter tube 1700 is lower than the temperature inside the filter tube 1700. The outer protrusion 1760 may adjust the temperature of the filter tube 1700 to a lower temperature than the temperature of the first line 1620 or the second line 1640 by increasing the area by which the filter tube 1700 is exposed to the outside. For example, the filter tube 1700 may be formed of a material having a higher thermal conductivity than the first line 1620 and the second line 1640. Accordingly, the filter tube 1700 may more rapidly radiate heat to the outside than the first line 1620 and the second line 1640 and may remain at a lower temperature than the first line 1620 and the second line 1640. Adhesion of the process by-products to the filter tube 1700 increases as the temperature of the filter tube 1700 is lowered. Accordingly, by lowering the temperature of the filter tube 1700, a large amount of process by-products may adhere to the filter tube 1700, and transfer of the process by-products to the opening/closing valve 1660 and the pressure-reducing member 1680 may be minimized.

The opening/closing valve 1660 adjusts exhaust pressure applied by the pressure-reducing member 1680. The opening/closing valve 1660 opens or closes the exhaust line 1610. The opening/closing valve 1660 is movable between an open position and a closed position. The opening/closing valve 1660 is movable in a direction perpendicular to the lengthwise direction of the exhaust line 1610. The opening/closing valve 1660 is able to rectilinearly move or swing. Here, the open position is a position in which the exhaust line 1610 is opened by the opening/closing valve 1660, and the closed position is a position in which the exhaust line 1610 is closed by the opening/closing valve 1660. According to an embodiment, a partial region of the exhaust line 1610 may be open during a process.

Hereinafter, a method for treating the substrate W using the above-described substrate treating apparatus will be described. When the substrate W is placed on the substrate support unit 1200, the treatment space 1106 is sealed from the outside, and plasma is supplied into the treatment space 1106 to etch the substrate W. The plasma reacts with the substrate W to form process by-products. The process by-products are released to the exhaust line 1610 through the baffle 1500. The process by-products are filtered by the filter tube 1700 in the process of being released. When the substrate W is completely treated, the supply of the plasma is stopped, and the substrate W is unloaded from the treatment space 1106. Thereafter, maintenance of the substrate treating apparatus is performed.

When the maintenance is performed, a worker seals the treatment space 1106 from the outside and separates a filter tube 1700a from the first line 1620 and the second line 1640. The separated filter tube 1700a is moved into an external cleaning system and cleaned by the external cleaning system. A cleaning pump 1800 is connected to the first line 1620 from which the filter tube 1700a is separated. The cleaning pump 1800 is implemented with the pressure-reducing member 1680 for forcibly evacuating the treatment space 1106 during the maintenance process. As the cleaning pump 1800 forcibly evacuates the treatment space 1106, the process by-products remaining in the treatment space 1106 are forcibly released by the cleaning pump 1800. Accordingly, the amount of the process by-products transferred to the opening/closing valve 1660 and the pressure-reducing member 1680 may be reduced. When the maintenance is completed, the cleaning pump 1800 is separated from the first line 1620, and the cleaned filter tube 1700a or a new filter tube 1700b is connected to the first line 1620 and the second line 1640.

Figure 9:
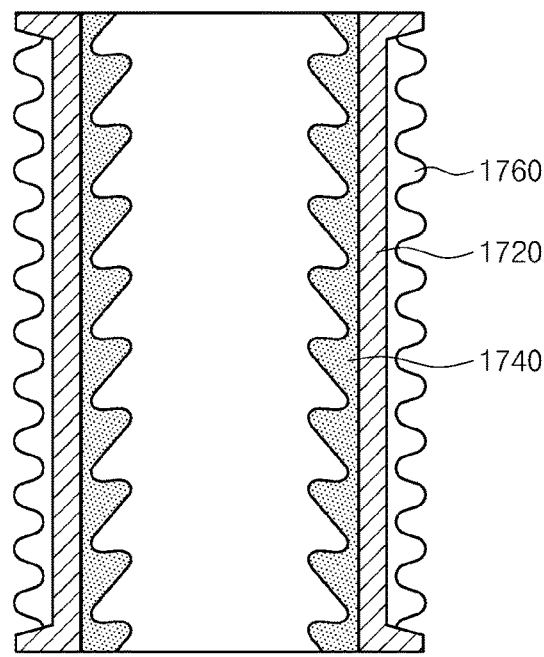
FIG. 9 is a sectional view illustrating a second embodiment of the filter tube of FIG. 5.

Next, a second embodiment of the filter tube 1700 will be described. FIG. 9 is a sectional view illustrating the second embodiment of the filter tube of FIG. 5. Referring to FIG. 9, a filter tube 1702 has a plurality of inner protrusions 1740. The inner protrusions 1740 may be spaced apart from each other along the lengthwise direction of a body 1720.

Figure 10:
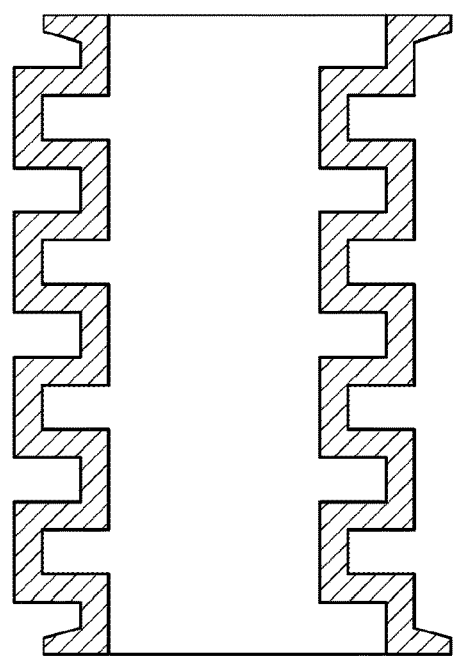
FIG. 10 is a sectional view illustrating a third embodiment of the filter tube of FIG. 5.

FIG. 10 is a sectional view illustrating a third embodiment of the filter tube. Referring to FIG. 10, a filter tube 1704 may have a shape in which a sidewall has a convex portion and a concave portion alternating with each other. An outer circumferential surface and an inner circumferential surface of the filter tube 1704 each have convex portions and concave portions. When the outer circumferential surface has a convex portion, the inner circumferential surface opposite to the outer circumferential surface may have a concave portion. Accordingly, the filter tube 1704 may have a uniform inner diameter along the lengthwise direction thereof and may minimize exhaust pressure interference of the pressure-reducing member 1680. In addition, as the filter tube 1704 has a uniform sidewall thickness, the temperature of the filter tube 1704 may be uniformly maintained by region.

In this embodiment, the amount of process by-products adhering to the opening/closing valve 1660 and the pressure-reducing member 1680 is minimized by depositing a large amount of process by-products onto the filter tube 1700 and replacing the filter tube 1700. The pressure-reducing member 1680 may be connected to a plurality of process chambers 1100. In a case where the pressure-reducing member 1680 is damaged by process by-products adhering thereto, the pressure-reducing member 1680 has to be replaced. However, the pressure-reducing member 1680 is very difficult to replace and is expensive to replace.

However, in this embodiment, the filter tube 1700 is installed and replaced. The filter tube 1700 may be easy to replace, compared with the pressure-reducing member 1680 and the opening/closing valve 1660, and replacement cost may be reduced. Furthermore, the pressure-reducing member 1680 and the opening/closing valve 1660 are implemented with a device including an actuator such as a motor. Accordingly, the filter tube 1700 is easy to clean, compared with the pressure-reducing member 1680 and the opening/closing valve 1660.

According to the embodiments of the inventive concept, the exhaust line has the detachable filter tube. Accordingly, process by-products adhering to the filter tube may be easily removed by replacing the filter tube.

Furthermore, according to the embodiments of the inventive concept, the filter tube has the corrugated inner surface. Accordingly, a large amount of process-byproducts may adhere to the inner surface of the filter tube, and the amount of process by-products transferred to the pressure-reducing member may be reduced.

In addition, according to the embodiments of the inventive concept, the filter tube has the corrugated outer surface. Accordingly, the outer surface and the externally exposed area may be increased, the temperature of the filter tube may be lowered, and the amount of process by-products adhering to the filter tube may be increased.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising: a chamber having a treatment space in which the substrate is treated; a substrate support unit configured to support the substrate in the treatment space; a gas supply unit configured to supply a gas into the treatment space; an exhaust line connected to the chamber; and a pressure-reducing member configured to reduce pressure in the exhaust line and release process by-products generated in the treatment space, wherein the exhaust line includes: a first line connected to the chamber; a second line equipped with the pressure-reducing member; and a filter tube configured to connect the first line and the second line, and wherein the filter tube has a corrugated side surface, and wherein the filter tube is formed of a material having a higher thermal conductivity than first line and the second line such that the filter tube radiates heat from inside the filter tube to outside the filter tube and the filter tube maintains a temperature of the filter tube that is lower than a temperature of the first line and the second line.

2. The apparatus of claim 1, wherein the filter tube is detachable from the first line and the second line.

3. The apparatus of claim 2, wherein an outer circumferential surface of the filter tube has a corrugated shape, and
   wherein the filter tube has a lower temperature than the first line and the second line.

4. The apparatus of claim 3, wherein the second line is equipped with a valve configured to open or close the exhaust line.

5. The apparatus of claim 1, wherein the filter tube has a corrugated outer circumferential surface, and
   wherein the filter tube includes:
      a body having opposite open ends; and
      an inner protrusion protruding from an inner surface of the body.

6. The apparatus of claim 5, wherein the inner protrusion has a spiral shape configured to surround a central axis of the body.

7. The apparatus of claim 5, wherein the inner protrusion includes a plurality of inner protrusions having an annular ring shape and arranged along a lengthwise direction of the body.

8. The apparatus of claim 5, wherein in a cut section obtained by cutting the filter tube in a lengthwise direction, the inner protrusion is provided to be inclined such that a direction from the inner surface of the body toward an inside end thereof is oriented in an upstream direction of the filter tube with an approach to a central axis of the body.

9. An exhaust unit for releasing process by-products generated in a treatment space of a chamber, the exhaust unit comprising: an exhaust line connected to the chamber; and a pressure-reducing member configured to reduce pressure in the exhaust line, wherein the exhaust line includes: a first line connected to the chamber; a second line equipped with the pressure-reducing member; and a filter tube configured to connect the first line and the second line, and wherein the filter tube has a corrugated side surface, and wherein the filter tube is formed of a material having a higher thermal conductivity than the first line and the second line such that the filter tube radiates heat from inside the filter tube to outside the filter tube and the filter tube maintains a temperature of the filter tube that is lower than a temperature of the first line and the second line, wherein temperature outside the filter tube is lower than temperature inside the filter tube, and wherein the filter tube is formed of a material having a higher thermal conductivity than the first line and the second line.

10. The exhaust unit of claim 9, wherein the filter tube is detachable from the first line and the second line.

11. The exhaust unit of claim 10, wherein an outer circumferential surface of the filter tube has a corrugated shape, and
   wherein the filter tube has a lower temperature than the first line and the second line.

12. The exhaust unit of claim 11, wherein the second line is equipped with a valve configured to open or close the exhaust line.

13. The exhaust unit of claim 10, wherein the filter tube has a corrugated outer circumferential surface, and wherein the filter tube includes:
a body having opposite open ends; and
an inner protrusion protruding from an inner surface of the body.

14. The exhaust unit of claim 13, wherein in a cut section obtained by cutting the filter tube in a lengthwise direction, the inner protrusion is provided to be inclined such that a direction from the inner surface of the body toward an inside end thereof is oriented in an upstream direction of the filter tube with an approach to a central axis of the body.

\* \* \* \* \*